(12) United States Patent
Hormadaly

(10) Patent No.: US 6,171,987 B1
(45) Date of Patent: Jan. 9, 2001

(54) CADMIUM-FREE AND LEAD-FREE GLASS COMPOSITIONS, THICK FILM FORMULATIONS CONTAINING THEM AND USES THEREOF

(75) Inventor: Jacob Hormadaly, Omer (IL)

(73) Assignee: Ben-Gurion University of the Negev (IL)

( * ) Notice: Under 35 U.S.C. 154(b), the term of this patent shall be extended for 0 days.

(21) Appl. No.: 09/143,134

(22) Filed: Aug. 28, 1998

Related U.S. Application Data

(63) Continuation-in-part of application No. 08/998,967, filed on Dec. 29, 1997, now abandoned.

(51) Int. Cl.$^7$ .............................. C03C 1/00; C03C 3/066; C03C 3/078; C03C 3/083
(52) U.S. Cl. ................................. 501/26; 501/17; 501/18; 501/20; 501/21; 501/24; 501/25; 501/32; 501/19; 501/57; 501/58; 501/59; 501/67; 501/63; 501/70; 501/77; 501/79; 428/426
(58) Field of Search .................................. 501/17, 18, 20, 501/21, 24, 25, 26, 32, 19, 59, 55, 63, 67, 70, 77, 79, 57, 58; 428/426

(56) References Cited

U.S. PATENT DOCUMENTS

| | | |
|---|---|---|
| 4,554,258 | 11/1985 | Francel . |
| 4,613,539 | 9/1986 | Hormadaly . |
| 4,707,346 | 11/1987 | Hormadaly . |
| 4,892,847 | 1/1990 | Reinherz . |
| 4,906,406 * | 3/1990 | Hormadaly .............................. 501/32 |
| 4,966,926 | 10/1990 | Donohue . |
| 4,970,178 | 11/1990 | Klimas et al. . |
| 5,114,885 | 5/1992 | Hormadaly . |
| 5,244,848 | 9/1993 | Clifford et al. . |
| 5,252,521 | 10/1993 | Roberts . |
| 5,308,803 | 5/1994 | Clifford et al. . |
| 5,439,852 | 8/1995 | Hormadaly . |
| 5,468,695 | 11/1995 | Carroll et al. . |
| 5,491,118 | 2/1996 | Hormadaly . |
| 5,605,869 | 2/1997 | Mangat et al. . |
| 5,616,417 | 4/1997 | Ryan . |

* cited by examiner

Primary Examiner—Michael Marcheschi
(74) Attorney, Agent, or Firm—Lerner, David, Littenberg, Krumholz & Mentlik, LLP

(57) ABSTRACT

A glass composition comprising, in mole percent of the total composition:
glass-forming compounds in a total amount of 75 to 85%, wherein said glass forming compounds comprise 40 to 65% $SiO_2$, 10 to 20% $Bi_2O_3$ and 0.1 to 3% $Al_2O_3$, and
glass modifiers in a total amount of 15 to 25%, wherein said glass modifiers comprise 1 to 23 % ZnO, 0.1 to 5% CuO, 0.1 to 5 CaO and 0.1 to 2% MgO, thick film formulations containing said composition and uses thereof.

17 Claims, No Drawings

CADMIUM-FREE AND LEAD-FREE GLASS COMPOSITIONS, THICK FILM FORMULATIONS CONTAINING THEM AND USES THEREOF

CROSS-REFERENCE TO RELATED APPLICATIONS

This application is a continuation-in-part of application Ser. No. 08/998,967 filed Dec. 29, 1997 now abandoned.

FIELD OF THE INVENTION

The invention relates to low-softening point, cadmium-free and lead-free glass compositions which are suitable for thick film applications.

BACKGROUND OF THE INVENTION

Encapsulant systems made of glass are widely used, in particular in the electronics industry. One major aspect of their functions involves the protection of the electronic components from the environment. For example, the encapsulation of conductor metals protects them from long-term corrosion, while hybrid circuits should be encapsulated to insure resistor stability in a humid atmosphere.

A glass composition suitable for encapsulant systems must exhibit a wide range of desired physical and chemical features, such as low melting point, limited thermal expansion, appropriate flowability, and good resistance to acid or base attack. However, as will now be explained, it is difficult to group together all of the properties indicated above.

For example, in order to protect the electrical components from the environment, the encapsulant should have sufficient durability to survive the environments encountered in the production and the daily use of the electronic circuits. Most glasses having a low softening point are characterized by poor durability in acids and bases, and their durability tends to degrade as the glass transition temperature (Tg) becomes lower. Although the majority of electronic circuits are not expected to be used in very acidic or basic environments, some are exposed to water and basic or acidic environments during the production. Furthermore, since the final stage in some fabrication processes involves an additional encapsulation by an organic polymer, e.g., an epoxy, wherein some of these resins contain an amine that can exert basic environment in a humid atmosphere, it is important that the system be able to withstand said conditions, as well.

Another difficulty in formulating a suitable glass composition for encapsulation systems stems from the fact that various glasses having low glass transition temperature (Tg) are usually characterized by a high temperature coefficient of expansion, herein designated as a, which, unless it is carefully matched to the adjacent circuit layers, can set up substantial mechanical stresses which can lead to system failure.

The degree of flowability which is required from the glass at the firing temperature is yet another feature which must be carefully controlled. The encapsulant must form a bubble-free seal at a low enough firing temperature without interacting with the underlying electrical components. If the glass flows too much, it will diffuse into the electrical components, thereby altering its electrical characteristics. If it does not flow enough, it will not seal. The organic vehicle necessary for the screen printing operation must burn out at this temperature. Thus, an ideal encapsulant should screen print smoothly and rapidly with a vehicle which is decomposable at a temperature low enough to allow the glass to flow sufficiently to form a seal, but not so much as to alter the resistor electrical characteristics.

The prior art countered these problems in various ways. The introduction of cadmium and lead to the glass composition provides important characteristics such as moderate linear coefficient of expansion, low viscosity at fairly low temperatures, improved resistance and durability compared to glasses containing high concentrations of alkali oxides. A glass composition comprising PbO is illustrated, for example, in U.S. Pat. No. 5,114,885 to Hormadaly. However, adverse toxicological effects attributed to cadmium and lead have resulted in various restrictions in the use of such glass compositions, despite their excellent properties.

The art has also attempted to provide cadmium-free and lead-free glass compositions, but these compositions suffer from various drawbacks and do not provide fully satisfactory properties.

U.S. Pat. No. 4,613,539 and U.S. Pat. No. 4,707,346 to Hormadaly, and U.S. Pat. No. 4,966,926 to Donhaue, disclose conductive phases such as $LaBr_6$, and compositions of tantalum and/or niobium doped tin oxide conductive materials. These materials contain Cd and Pb-free glasses, and require processing in an inert atmosphere. They cannot be processed in air, because the conductive phase will oxidize. The oxidation in air renders these conductive phases insulators ($LaB_6$) and inappropriate (doped $SnO_2$) for resistor use, due to intrinsic change in electrical properties. In addition, these patents disclose glass compositions with high melting points, which prevents them from being used in low temperature overglaze applications. U.S. Pat. No. 4,892,847 to Reinherz discloses glass compositions containing $Bi_2O_3$ as the major ingredient for vitreous coating applications. The compositions according to Reinherz have critical compositional limits for the $SiO_2$, $Bi_2O_3$, $B_2O_3$ and the alkali oxides ingredients, the concentration of said $Bi_2O_3$ typically being below 10 mole % and the concentration of said $B_2O_3$ typically being above 15 mole %. They are alleged to exhibit a variety of desirable properties. However, their performance characteristics are still not satisfactory. For example, the reported thermal coefficients of expansion for these glasses, being in the relatively high range between 70 to $90 \cdot 10^{-7}/°$ C., diminish their applicability to thick film microelectronics. The durability of the glasses according to U.S. Pat. No. 4,892,847, which has been tested only in mild conditions (citric acid and commercial dishwasher detergent), was found to be below the required degree to withstand the attack of 0.1N HCl and 0.1N NaOH solutions.

U.S. Pat. Nos. 5,439,852 and 5,491,118 to Hormadaly disclose $Bi_2O_3$ glasses with a broad concentration range of 5–70 mole %. However, it has been found that these glasses lack sufficient durability in acidic and basic environments. In addition, it has been found that the thermal expansion of these glasses is too high for the overglaze applications.

U.S. Pat. No. 4,970,178 to Klimas et al. discloses glass compositions for use in vitreous coatings consisting essentially of $SiO_2$, $B_2O_3$ and $Na_2O$, $Bi_2O_3$ being an optional additional ingredient in an amount not higher than 10 mole %. The durability of the compositions according to U.S. Pat. No. 4,970,178 was tested only with respect to an acid attack, the acid being 4% acetic acid.

It is therefore an object of the present invention to provide a glass composition which is cadmium-free and lead-free, having sufficient durability in acidic and basic environments.

It is another object to provide thick film formulations comprising the glass compositions of the present invention for various applications.

Additional objects and advantages of the present invention will become apparent as the description proceeds.

SUMMARY OF THE INVENTION

It has now been found by the inventor that by appropriately choosing the ingredients of the glass composition and controlling their concentrations within well-specified ranges, it is possible to obtain a low-softening point glass which is free of cadmium and lead, and yet possesses valuable physical and chemical properties which render the glass useful for various purposes, in particular, as encapsulant systems for microelectronics applications.

The invention provides a glass composition comprising, in mole percent of the total composition:

glass-forming compounds in a total amount of 75 to 85%, wherein said glass forming compounds comprise 40 to 65% $SiO_2$, 10 to 20% $Bi_2O_3$ and 0.1 to 3% $Al_2O_3$, and glass modifiers in a total amount of 15 to 25%, wherein said glass modifiers comprise 1 to 23% ZnO, 0.1 to 5% CuO, 0.1 to 5 CaO and 0.1 to 2% MgO.

Hereinafter, by the term "glass-forming compounds" is meant the class of compounds each of which is capable of forming a glass by itself upon melting and cooling, as well as the class of compounds which are usually known in the art as "conditional glass-forming compounds". Conditional glass-forming compounds do not form a glass by themselves upon melting and cooling, however, they form a glass when mixed with another appropriate compound. $SiO_2$ is a compound belonging to the first class, whereas $Bi_2O_3$ and $Al_2O_3$ are members of the second class. Suitable glass-forming compounds as defined above, in addition to $SiO_2$, $Bi_2O_3$, and $Al_2O_3$, may be selected, for example, from among the group consisting of $B_2O_3$, $GeO_2$, $P_2O_5$, $Sb_2O_3$, $TeO_2$, $TiO_2$ and $ZrO_2$ or mixtures thereof. Among these compounds, most preferred are $B_2O_3$, in an amount of at most 15 mole %, $TiO_2$ and/or $ZrO_2$, the sum of the amounts of said $TiO_2$ and/or $ZrO_2$ being at most 5 mole % of the total composition. The total amount of all glass forming compounds, i.e., $SiO_2$, $Bi_2O_3$, and $Al_2O_3$ and the optional additional glass forming compounds, which are preferably selected from the group consisting of $B_2O_3$, $GeO_2$, $P_2O_5$, $Sb_2O_3$, $TeO_2$, $TiO_2$ and $ZrO_2$ or mixtures thereof, is 75 to 85 mole % of the total composition.

The term "glass modifiers" is herein used to define a class of oxides and halogen compounds which do not possess the ability to form a glass by themselves upon melting and cooling, nor when contacted with additional compounds, other than, of course, compounds belonging to the class of glass forming compounds described above. However, the glass modifiers are capable of modifying the chemical and physical properties of the glasses containing them. ZnO, CaO, CuO and MgO are known in the art as glass modifiers. Suitable glass modifiers which are optionally included in the glass compositions according to the present invention, in addition to ZnO, CaO, CuO and MgO, may be selected, for example, from the group consisting of SrO, BaO, oxides and/or fluorides of alkali metals, oxides of transition metals having an atomic number between 24 to 28, inclusive, or mixtures thereof. The total amount of all glass modifiers present in the composition, i.e., ZnO, CaO, CuO and MgO, and the optional additional glass modifiers, which are preferably selected from the group consisting of SrO, BaO, oxides and/or fluorides of alkali metals, oxides of transition metals having an atomic number between 24 to 28, inclusive, or mixtures thereof, is 15 to 25 mole % of the total composition.

The above definitions of the terms "glass-forming compounds" and "glass modifiers" are based on the general properties of the compounds as they are known and accepted in the art, without being bound to any explanation relative to the exact role of each of these compounds in the compositions according to the present invention.

Another aspect of the present invention relates to thick film formulations comprising finely divided particles of the glass of the present invention dispersed in an organic medium, optionally together with other solids, such as, for example, conductive metal particles or ceramic fillers, to various applications of said formulations and to an article comprising said formulation fired on a cermic substrate.

DETAILED DESCRIPTION OF PREFERRED EMBODIMENTS

In the discussion which follows, all compositional percentages are mole %, unless otherwise stated, and whenever compositional ranges are indicated, they should be understood as including the lower and upper limits.

The invention provides a glass composition comprising, in mole percent of the total composition:

glass-forming compounds in a total amount of 75 to 85%, wherein said glass forming compounds comprise 40 to 65% $SiO_2$, 10 to 20% $Bi_2O_3$ and 0.1 to 3% $Al_2O_3$, and glass modifiers in a total amount of 15 to 25%, wherein said glass modifiers comprise 1 to 23% ZnO, 0.1 to 5% CuO, 0.1 to 5 CaO and 0.1 to 2% MgO.

The amount Of $SiO_2$ in the glass should be at least 40 mole % of the total composition, to render the viscosity of the glass suitable for thick film overglaze applications and for encapsulation of conductors. It has also been found by the inventor that the amount of $SiO_2$ must not exceed the limit of 65 mole %, and preferably not 63 mole %, otherwise the softening point becomes too high for overglaze applications. Preferably, the amount of $SiO_2$ is between 45 to 63 mole %, inclusive.

The range of amounts of the $Bi_2O_3$ according to the present invention is between 10 to 20 mole % of the total composition, inclusive. Within that range, the viscosity and durability of the glass are suitable for applications in thick film formulations. Preferably, the amount of $Bi_2O_3$ is between 12 to 18 mole %, inclusive, more preferably around 15 mole %.

The range of amounts of the $Al_2O_3$, according to the present invention, is between 0.1 to 3 mole % of the glass composition, inclusive. Within that range, the $Al_2O_3$ has a beneficial effect on the durability, glass-forming ability and the thermal expansion of the glass. Preferably, the amount of $Al_2O_3$ will be between 0.5 to 2.5 mole %, inclusive, most preferably around 2 mole %.

According to a preferred embodiment of the present invention, the glass composition may optionally comprise glass-forming compounds in addition to $SiO_2$, $Bi_2O_3$ and $Al_2O_3$, wherein the total amounts of said $SiO_2$, $Bi_2O_3$, $Al_2O_3$ and said optional glass-forming compounds being between 75 to 85 mole % of the total composition, inclusive. Suitable glass-forming compounds as defined above, in addition to $SiO_2$, $Bi_2O_3$, and $Al_2O_3$, may be selected, for example, from the group consisting of $B_2O_3$, $GeO_2$, $P_2O_5$, $Sb_2O_3$, $TeO_2$, $TiO_2$ and $ZrO_2$ and mixtures thereof. Among these compounds, most preferred are $B_2O_3$, $TiO_2$ and $ZrO_2$. $B_2O_3$, when introduced in appropriate amounts, may assist in retaining the softening point within a relatively low temperature range, while $TiO_2$ and $ZrO_2$ enhance the durability of the glass composition, in particular, the durability in acidic and basic environments.

The range of amounts of $B_2O_3$, according to a preferred embodiment of the present invention, is at most 15 mole %, inclusive, of the total glass composition. Within that range, the $B_2O_3$ contributes to reduce the softening point of the glass and its viscosity at the 600–850° C. temperature range, and to stabilize the glass composition. Preferably, the amount of $B_2O_3$ is between 5 to 13 mole %, inclusive, and preferably around 10 mole % of the total composition.

In another preferred embodiment, the present invention provides a glass composition comprising, in mole percent of the total composition: glass-forming compounds in a total amount of 75 to 85%, wherein said glass forming compounds comprise 40 to 65% $SiO_2$, 10 to 20% $Bi_2O_3$, 0.1 to 3% $Al_2O_3$ and at most 15%, preferably between 5 to 13% $B_2O_3$, and glass modifiers in a total amount of 15 to 25%, wherein said glass modifiers comprise 1 to 23% ZnO, 0.1 to 5% CuO, 0.1 to 5 CaO and 0.1 to 2% MgO.

According to another preferred embodiment of the present invention, the total concentration of $TiO_2$ and $ZrO_2$, when included in the glass composition according to the present invention, is at most 5 mole % of the total composition, preferably between 1 to 5 mole %, more preferably between 3 to 5 mole %.

In another preferred embodiment, the present invention provides a glass composition comprising, in mole percent of the total composition:
glass-forming compounds in a total amount of 75 to 85%, wherein said glass forming compounds comprise 40 to 65% $SiO_2$, 10 to 20% $Bi_2O_3$, 0.1 to 3% $Al_2O_3$, and 0 to 3% $TiO_2$ and/or 0 to 2% $ZrO_2$, the sum of amounts of said $TiO_2$ and/or $ZrO_2$ being preferably between 1 to 5%, and
glass modifiers in a total amount of 15 to 25%, wherein said glass modifiers comprise 1 to 23% ZnO, 0.1 to 5% CuO, 0.1 to 5 CaO and 0.1 to 2% MgO.

In a preferred embodiment, the present invention also provides a glass composition comprising, in mole percent of the total composition:
glass-forming compounds in a total amount of 75 to 85%, wherein said glass forming compounds comprise 40 to 65% $SiO_2$, 10 to 20% $Bi_2O_3$, 0.1 to 3% $Al_2O_3$, 5 to 13% $B_2O_3$ and $TiO_2$ and/or $ZrO_2$, the sum of amounts of said $TiO_2$ and/or $ZrO_2$ being between 1 to 5%, and
glass modifiers in a total amount of 15 to 25%, wherein said glass modifiers comprise 1 to 23% ZnO, 0.1 to 5% CuO, 0.1 to 5 CaO and 0.1 to 2% MgO.

ZnO, CaO, CuO and MgO are considered in the art as glass modifiers. The glass composition according to the present invention may include additional glass modifiers which may be selected, for example, from among the group consisting of SrO, BaO, oxides and/or fluorides of alkali metals, oxides of transition metals having an atomic number between 24 to 28, inclusive, or mixtures thereof. The total amount of all glass modifiers present in the composition, i.e., ZnO, CaO, CuO and MgO and the optional glass modifiers which may be included is 15 to 25 mole % of the total composition. Preferably, the amount of SrO or BaO is in the range between 0 to 6 mole %, most preferably between 2 to 5, inclusive. Preferably, the alkali metals oxides and fluorides are selected from among the group consisting of $Li_2O$, $Na_2O$, LiF and NaF, their total amount being preferably not higher than 6 mole %, inclusive, most preferably between 3 to 5 mole % of the total composition. The total amounts of the oxides of transition metals, said metals having an atomic number between 24 to 28, inclusive, is at most 8 mole %, and most preferably, between 1 to 7 mole % of the total composition.

The above-mentioned glass modifiers alter the properties of the glass composition in various aspects, as will now be illustrated.

ZnO lowers the thermal coefficient of expansion of the glass and modifies its viscosity. The preferred amount of ZnO according to the present invention ranges between 6 to 18 mole %.

MgO lowers the thermal expansion of the glass composition and upon increasing its concentration, the composition is rendered more viscous. The preferred amount of MgO according to the present invention ranges between 0.5 to 2 mole %, preferably around 1 mole %.

CuO tends to lower the thermal coefficient of expansion when substituted for the alkali and alkaline earth oxides. In addition, the introduction of CuO has the effects of lowering the viscosity and coloring the glass. The color can vary from light green to black, and it intensifies upon increasing the concentration of CuO. The preferred concentration of CuO according to the present invention ranges between 0.5 to 4 mole %.

$Na_2O$, $Li_2O$, NaF and LiF, while lowering the viscosity of the glass composition, increase the thermal coefficient of expansion, and when included at total concentrations higher than 6 mole %, tend to impair the durability. As to the alkaline-earth oxides, it is known that their effect on the thermal coefficient of expansion of the glass composition, when used at equal mole %, is according to the following decreasing order: BaO>SrO>CaO>MgO. The preferred concentration of CaO according to the present invention is comprised between about 2 to 4 mole %.

In preferred embodiments of the invention, oxides of transition metals, the atomic number of said metals being between 24 to 28, inclusive, are included in the composition, as they stabilize the glass and have a beneficial catalytic effect on the pyrolysis of the organic medium when applying the thick film paste formulations comprising said medium and the glass dispersed therein. In addition to the catalytic effect, the transition metal oxides can also be used to lower the thermal coefficient of expansion, and in small amounts, typically around 2 mole %, they are also useful for coloring the glasses of the present. For example, the inclusion of Cr and Co imparts to the glass a green color or a blue color, respectively.

Preparation of the glasses:

The preparation of the glasses of the present invention can be carried out by conventional methods which are well known in the art. For example, one such method consists of mixing together in the desired proportions the oxide or fluoride precursors, melting the mixture and pouring the molten composition into water to form the frit. An oxide or fluoride precursor may, of course, be any compound that will yield the desired oxide or fluoride under the usual conditions of frit production. For example, boric oxide will be obtained from boric acid; silicon dioxide will be produced from flint; barium oxide will be produced from barium carbonate; etc. The glass is preferably milled in a ball mill with water to reduce the particle size. As is well known in the art, melting is conducted at a peak temperature and for a time such that the melt becomes entirely liquid and homogeneous.

In preparing the glasses of the present invention, the components are premixed by shaking in a polyethylene jar with plastic balls, and are then melted in a platinum or a high purity alumina crucible at the desired temperature. The melt is maintained at a peak temperature of 1100° C.–1400° C. for a period of 1½ hours. The melt is then poured into cold water. The maximum temperature of the water during quenching is kept as low as possible by increasing the volume of water to melt ratio. The crude frit after separation from water is freed from residual water by drying in air, or by displacing the water by rinsing with methanol. The crude frit is then ball milled for 3–15 hours in alumina containers using alumina balls. Alumina picked up by the materials, if any, is not within the observable limit as measured by X-ray diffraction analysis. After discharging the milled slurry from the frit, the powder is air-dried at room temperature. The dried powder is then screened through a 325 mesh screen to remove any large particles.

Another aspect according to the present invention is related to thick film formulations comprising finely divided particles of the glass according to the present invention dispersed, optionally together with additional solids selected according to the intended use of the formulation, in an organic medium. conductive metal particles, the total composition of the solids dispersed in the organic medium being between 0.5 to 80 weight % glass particles and between 20 to 99.5 weight % conductive metal particles.

In another preferred embodiment of the present invention, the thick film formulation comprises additional solids which are ceramic fillers, the weight of said ceramic fillers being not higher than 20% of the total weight of solids dispersed in the organic medium. The ceramic fillers are, for example, selected from among vitreous silica, zircon and mixtures thereof.

Any inert liquid, such as various organic liquids, with or without thickening and/or stabilizing agents and/or other common additives, may be used as the medium. Suitable organic liquids are aliphatic alcohols or esters thereof, terpens such as pine oil, terpineol and the like, solutions of resins such as the polymethylacrylates of lower alcohols and solutions of ethyl cellulose in solvents such as pine oil and the monobutyl ether of ethylene glycol monoacetate. Preferred organic mediums are ethyl cellulose solutions in terpineol and butyl ethers of ethylene glycol.

Preparation of thick film formulations:

The preparation of thick film formulations according to the present invention can be carried out by conventional methods which are well known in the art. In the preparation of the formulations of the present invention, the particulate inorganic solids are mixed with the organic medium and dispersed with suitable equipment, such as a Muller, to form a suspension, resulting in a composition for which the viscosity will be in the range of about 100–150 pascalseconds at a shear rate of 4 $sec^{-1}$.

The thick film formulation according to the present invention was prepared in the following manner: The organics used consisted of a mixture of diethylene glycol dibutyl ether, terpineol, and ethyl cellulose. The ingredients of the formulation, minus about 5 weight percent of the organic components, are weighed together in a container. The components are then vigorously mixed to form a uniform blend; then the blend is passed through dispersing equipment, such as a Muller, to achieve a good dispersion of particles. A Hegman gauge is used to determine the state of dispersion of the particles in the paste. This instrument consists of a channel in a block of steel that is 25 μm deep (1 mil) on one end and ramps up to 0" depth at the other end. A blade is used to draw down paste along the length of the channel. Scratches will appear in the channel where the agglomerates' diameter is greater than the channel depth. A satisfactory dispersion will give a fourth scratch point of 10–18 μm, typically. A fourth scratch measurement of >10 μm indicates a poorly dispersed suspension. The remaining 5% consisting of organic components of the paste is then added, and the resin content is adjusted to bring the viscosity, when fully formulated, to between 140 to 200 Pa.s at a shear rate of 4 $sec^{-1}$. The composition is then applied to a substrate, such as alumina ceramic, usually by the process of screen printing, to a wet thickness of about 30–80 microns, preferably 35–70 microns, and most preferably, 40–50 microns. The compositions of this invention can be printed onto the substrates either by using an automatic printer or a hand printer in the conventional manner, preferably employing automatic screen stencil techniques, using a 200 to 325 mesh screen. The printed pattern is then dried at below 200° C., about 150° C., for 5–15 minutes before firing. Firing to effect sintering of both the inorganic binder and the finely divided particles of metal is preferably done in a well ventilated belt conveyor furnace with a temperature profile that will allow burnout of the organic matter at about 300° C.–650° C., lasting about 5–15 minutes, followed by a controlled cool-down cycle to prevent over-sintering, unwanted chemical reactions at intermediate temperatures, or substrate fracture, which can occur from a too-rapid cool-down. The overall firing procedure will preferably extend over a period of about 1 hour, with 20–25 minutes to reach the firing temperature, about 10 minutes at the firing temperature, and about 20–25 minutes to cool down. In some instances, total cycle times as short as 30 minutes can be used.

The following examples are given for the purpose of illustration, and are not intended to limit the scope of the invention.

EXAMPLES

Examples 1–9

The compositions of 9 glasses and some physical and chemical characteristics of interest:

softening point obtained by Differential Thermal Analysis (DTA S.P° C.) and by dilatometric measurements (Td° C.);

coefficient of thermal expansion; and durability in 0.1N HCl solution (the test procedure is to follow), are detailed in Table I.

TABLE I

| | Glass composition in mole % | | | | | | | | |
|---|---|---|---|---|---|---|---|---|---|
| | Examples No. 1–9 | | | | | | | | |
| | 1* | 2* | 3* | 4* | 5 | 6 | 7 | 8 | 9 |
| $Li_2O$ | — | — | — | — | — | — | 1.52 | — | 3.96 |
| LiF | — | — | — | — | — | — | — | 3.00 | — |
| $Na_2O$ | — | — | — | — | — | — | 2.03 | — | 1.98 |
| NaF | — | — | — | — | — | — | — | 2.00 | — |
| CaO | 2.00 | 2.00 | 4.00 | 4.00 | 4.00 | 4.00 | 4.06 | 4.00 | 3.96 |
| MgO | 1.00 | 1.00 | 1.00 | 1.00 | 1.00 | 1.00 | 1.02 | 1.00 | 0.99 |
| BaO | 6.00 | 6.00 | 4.00 | 4.00 | 4.00 | 4.00 | — | — | — |
| CuO | 0.50 | 0.50 | 4.00 | 4.00 | 4.00 | 4.00 | 1.02 | 1.00 | 0.99 |
| ZnO | 6.00 | 6.00 | 6.00 | 6.00 | 6.00 | 6.00 | 10.15 | 10.00 | 9.90 |
| $Al_2O_3$ | 2.00 | 2.00 | 2.00 | 2.00 | 2.00 | 2.00 | 2.03 | 2.00 | 1.98 |
| $B_2O_3$ | 40.50 | 38.50 | 31.00 | 20.00 | 10.00 | — | 10.15 | 10.00 | 9.90 |
| $Bi_2O_3$ | 15.00 | 15.00 | 15.00 | 15.00 | 15.00 | 15.00 | 15.23 | 15.00 | 14.85 |
| $SiO_2$ | 25.00 | 25.00 | 30.00 | 41.00 | 51.00 | 61.00 | 49.74 | 49.00 | 48.51 |
| $TiO_2$ | 1.00 | 2.00 | 2.00 | 2.00 | 2.00 | 2.00 | 2.03 | 2.00 | 1.98 |
| $ZrO_2$ | 1.00 | 2.00 | 1.00 | 1.00 | 1.00 | 1.00 | 1.02 | 1.00 | 0.99 |
| DTA (S.P ° C.) | 503.9 | 508.5 | 500.7 | 500.8 | 517.3 | 551.9 | 498.1 | 492.3 | 480.8 |
| Td (° C.) | 500.6 | 503.6 | — | — | 522.1 | 561.5 | — | — | — |
| α ($10^{-7}$/° C.) | 76.6 | 64.2 | — | — | 68.4 | 71.5 | — | — | — |
| Loss in wt % of glass powder in 0.1N HCl | 52.0 | 49.9 | 43.0 | 43.0 | 9.2 | 1.05 | — | — | — |

*comparative example

Comparison of examples 1 and 2 shows that the substitution of $TiO_2$ and $ZrO_2$ for $B_2O_3$ has the effect of reducing the value of coefficient thermal expansion, while only slightly increasing the melting point.

Examples 3 to 6 facilitate a one-to-one comparison with the chemical composition: a decrease in the content of $B_2O_3$, raised the melting point. Complete elimination of $B_2O_3$ raised the melting point by ~10%.

Examples 7 to 9 illustrate glass compositions which are free from Ba.

It is evident from Table I that the durability of the glass compositions in 0.1N HCl is enhanced upon decreasing the $B_2O_3$ content. The comparison of examples 4 and 5 shows that above 10 mole % $B_2O_3$, the glass powder durability is significantly lessened.

Examples 10–18

Examples 10 to 18 are paste compositions prepared with the ball milled glasses of Table I. The organics used consist of a mixture of diethylene glycol dibutyl ether, terpineol and ethyl cellulose. Table II details the compositions (in weight percent) of said pastes (the glass applied for preparing the pastes are identified according to the numbers of Table I).

TABLE II

Paste Composition in Weight %

Examples No. 10–18

| | 10* | 11* | 12* | 13* | 14 | 15 | 16 | 17 | 18 |
|---|---|---|---|---|---|---|---|---|---|
| glass 1 | 82.4 | — | — | — | — | — | — | — | — |
| glass 2 | — | 75.5 | — | — | — | — | — | — | — |
| glass 3 | — | — | 71.8 | — | — | — | — | — | — |
| glass 4 | — | — | — | 73.1 | — | — | — | — | — |
| glass 5 | — | — | — | — | 76.2 | — | — | — | — |
| glass 6 | — | — | — | — | — | 78.3 | — | — | — |
| glass 7 | — | — | — | — | — | — | 69.9 | — | — |
| glass 8 | — | — | — | — | — | — | — | 70.0 | — |
| glass 9 | — | — | — | — | — | — | — | — | 77.4 |
| Organics | 17.6 | 24.5 | 28.2 | 26.9 | 23.8 | 21.7 | 30.1 | 30.0 | 22.6 |

*comparative example

Examples 19–27

Table III below summarizes durability data on fired overglaze compositions according to three tests described below. A, B and C refer to the percent weight loss in 0.1N HCl, 0.1N NaOH and 5% $CH_3COOH$ solutions, respectively. The durability tests were carried out as follows:

Sample Preparation: Paste was applied to weighed 96% $Al_2O_3$ substrates (1"×1"). The sample were dried and then heated in a box furnace at the following temperatures: 650° C. for examples 19 to 24 and 620° C. for examples 25 to 27. After firing for 10 minutes at the said peak temperature, the furnace was turned off, and the samples were cooled to room temperature. The weight of the glazed substrates was recorded (to provide weight of deposited glaze). Typically, about 50 mg glaze were deposited on each substrate. Glazed substrates were immersed in three different solutions for durability evaluation:

A) 0.1 N HCl for 30 minutes
B) 0.1 N NaOH for 30 minutes
C) 5% $CH_3COOH$ for 30 minutes Five specimens were used for each test.

Procedure: Five glazed substrates were placed in a glass beaker containing 50 ml of test solution. After 30 minutes at room temperature, the substrates were rinsed in deionized water and dried, and the test solution was transferred to a volumetric flask for AA (Atomic Absorption) and ICP (Incipient Coupled Plasma) analysis. The weights of the glazed substrates, after durability testing, were recorded (for calculation of weight loss). All weighing was performed on an analytical balance with ±0.1 mg sensitivity.

Weight loss in the range of 0.1 to 0.37% is within the range of error of measurements.

A similar procedure was applied for the durability tests performed on glass powders, the results of which were detailed hereinbefore: ~0.1 g of glass powder was placed in 50 ml of the test solution, at room temperature, for 30 minutes. The solids were filtered off from the solution, and the solution was transferred to a volumetric flask for AA and ICP analysis.

TABLE III

Fired overglazes durability data given in terms of weight loss in weight %

Example Nos. 19–27

| | | 19* | 20* | 21* | *22* | 23 | 24 | 25 | 26 | 27 |
|---|---|---|---|---|---|---|---|---|---|---|
| composition 10 | A | 3.54 | — | — | — | — | — | — | — | — |
| | B | 0.27 | — | — | — | — | — | — | — | — |
| | C | 4.48 | — | — | — | — | — | — | — | — |
| composition 11 | A | — | 1.43 | — | — | — | — | — | — | — |
| | B | — | 0.47 | — | — | — | — | — | — | — |
| | C | — | 1.97 | — | — | — | — | — | — | — |
| composition 12 | A | — | — | 2.73 | — | — | — | — | — | — |
| | B | — | — | 0.83 | — | — | — | — | — | — |
| | C | — | — | 0.49 | — | — | — | — | — | — |
| composition 13 | A | — | — | — | 1.77 | — | — | — | — | — |
| | B | — | — | — | 0.12 | — | — | — | — | — |
| | C | — | — | — | 0.63 | — | — | — | — | — |
| composition 14 | A | — | — | — | — | 0.24 | — | — | — | — |
| | B | — | — | — | — | 0.31 | — | — | — | — |
| | C | — | — | — | — | 0.30 | — | — | — | — |
| composition 15 | A | — | — | — | — | — | 0.23 | — | — | — |
| | B | — | — | — | — | — | 0.18 | — | — | — |
| | C | — | — | — | — | — | 0.19 | — | — | — |
| composition 16 | A | — | — | — | — | — | — | 0.29 | — | — |
| | B | — | — | — | — | — | — | 0.10 | — | — |
| | C | — | — | — | — | — | — | — | — | — |
| composition 17 | A | — | — | — | — | — | — | — | 0.05 | — |
| | B | — | — | — | — | — | — | — | 0.03 | — |
| | C | — | — | — | — | — | — | — | — | — |

TABLE III-continued

Fired overglazes durability data given in terms of weight loss in weight %

| | | Example Nos. 19–27 | | | | | | | | |
|---|---|---|---|---|---|---|---|---|---|---|
| | | 19* | 20* | 21* | *22* | 23 | 24 | 25 | 26 | 27 |
| composition 18 | A | — | — | — | — | — | — | — | — | 0.30 |
| | B | — | — | — | — | — | — | — | — | 0.06 |
| | C | — | — | — | — | — | — | — | — | — |

*comparative example

The following trends are evident from Table III:

1) Gradual substitution of $SiO_2$ for $B_2O_3$ (examples 21 to 24) increased the chemical resistance, and a significant improvement in durability was observed when the molar percentage of $B_2O_3$ was dropped from 20 to 10 mole %.
2) Fired glazes were more resistant to basic solution than to acidic solution.
3) Resistance to 5% $CH_3COOH$ solution decreased with increased $B_2O_3$ content in the glass (examples 20 and 21).

Examples 28–36

The compositions of additional nine glasses, in accordance with the present invention, are detailed in Table IV. The glasses were prepared in a high purity alumina crucible. Typically, 300 g batch was mixed, placed in the crucible (in 2 or 3 portions) and melted in the 1200° C. Lindberg furnace. Some compositions required a higher melting temperature; the hot crucible was transferred to a preheated 1700° C. Lindberg furnace and heated to ~1250° C. for 5 to 10 minutes, then fritted into distilled water. Raw frit (200 g) was ball-milled (with 200 g water) for ~16 hours, then slip dried in the oven (150° C.) for ~12 hours.

TABLE IV

Glass composition in mole %

| | Example No. 28–36 | | | | | | | | |
|---|---|---|---|---|---|---|---|---|---|
| | 26 | 29 | 30 | 31 | 32 | 33 | 34 | 35 | 36 |
| $SiO_2$ | 56.00 | 54.90 | 63.00 | 40.00 | 58.00 | 60.00 | 53.00 | 63.00 | 55.00 |
| $Bi_2O_3$ | 17.00 | 20.00 | 10.00 | 20.00 | 18.50 | 18.00 | 15.00 | 20.00 | 18.00 |
| $Al_2O_3$ | 2.00 | 0.1 | 3.00 | 1.50 | 2.00 | 2.00 | 2.00 | 2.00 | 2.00 |
| ZnO | 17.00 | 23.00 | 19.4 | 17.00 | 13.00 | 14.00 | 14.00 | 10.00 | 3.00 |
| MgO | 1.00 | 0.1 | 2.00 | 1.00 | 2.00 | 1.00 | 1.00 | 1.00 | 2.00 |
| CuO | 3.00 | 0.1 | 2.50 | 3.00 | 4.00 | 2.00 | 2.00 | 2.00 | 5.00 |
| CaO | 4.00 | 1.80 | 0.1 | 4.00 | 3.00 | 3.00 | 3.00 | 2.00 | 5.00 |
| $B_2O_3$ | | | | 13.00 | | | 10.00 | | 10.00 |

Examples 37–45

Examples 37 to 45 are paste compositions prepared with the ball milled glasses of Table V. Pastes were compounded with 7.0 g ball-milled frit (the glasses applied for preparing the pastes are identified according to the numbers of Table IV), the organics used being 2.0 g of DuPont's medium M2619 (mixture of ethyl cellulose and teperpineol and dibutyl carbitol) and solvents. Three mixings (each 25 revolutions) on the muller were used to prepare each paste.

TABLE V

Paste Composition in grams

| | Example No. 37–45 | | | | | | | | |
|---|---|---|---|---|---|---|---|---|---|
| | 37 | 38 | 39 | 40 | 41 | 42 | 43 | 44 | 45 |
| glass 28 | 7.0 | — | — | — | — | — | — | — | — |
| glass 29 | — | 7.0 | — | — | — | — | — | — | — |
| glass 30 | — | — | 7.0 | — | — | — | — | — | — |
| glass 31 | — | — | — | 7.0 | — | — | — | — | — |
| glass 32 | — | — | — | — | 7.0 | — | — | — | — |
| glass 33 | — | — | — | — | — | 7.0 | — | — | — |
| glass 34 | — | — | — | — | — | — | 7.0 | — | — |
| glass 35 | — | — | — | — | — | — | — | 7.0 | — |
| glass 36 | — | — | — | — | — | — | — | — | 7.0 |
| Organics: | | | | | | | | | |
| M2619 | 2.0 | 2.0 | 2.0 | 2.0 | 2.0 | 2.0 | 2.0 | 2.0 | 2.0 |
| terpineol | 0.25 | 0.11 | 0.15 | 0.2 | 0.2 | 0.21 | 0.25 | 0.15 | 0.2 |
| dibutyl-carbitol | 0.25 | 0.11 | 0.15 | 0.2 | 0.2 | 0.21 | 0.25 | 0.15 | 0.2 |

Examples 46–54

Tables VI and VII below summarize durability data on fired overglaze paste compositions indicated as examples 46 to 54, corresponding to paste compositions 37–46 of Table V, according to two tests, designated A and B, which tests refer to the average weight loss in 0.1N HCl and 0.1N NaOH solutions, respectively, given in terms of weight loss in miligrams (Table VI) and in weight percent (Table VII). The durability tests were carried out as follows:

Sample Preparation: Pastes were printed on 1×1 96% alumina substrates, dried and fired. 10 parts were prepared from each paste. Firing was carried out in a box furnace, using 20° C/min ramp to 650° C. and dwell of 10 minutes at 650° C., then fast-cooled to room temperature.

Procedure: Five parts were treated in 0.1N HCl for 30 minutes at room temperature, rinsed, dried and then weighed to determine weight loss. Five parts were treated in 0.1N NaOH for 30 minutes at room temperature, rinsed, dried, and weighed to determine weight loss in basic solution.

The durability tests include marking and weighing of 1×1 alumina substrates using an analytical balance with accuracy of ±0.1 mg, then deposition, drying and firing of the paste.

Subsequently, fired parts were weighed to determine the weight of deposited fired paste. Durability tests were performed on fired parts, followed by a third weighing. A total of 3 weighings are required to determine weight loss. The errors are: ±0.1 mg for the substrate weighing, ±0.1 mg for the weighing of the substrate having the paste deposited thereon, and ±0.1 mg for weight loss in HCl or NaOH. The total propagated error is ±0.3 mg. Therefore, data with a weight loss of of $\leq 0.3$ mg are within the propagated error of these tests. For example, an experimental weight loss of 0.6 mg is 0.6±0.3 mg.

TABLE VI

Fired overglazes durability data given in terms of weight loss in mg
Examples Nos. 46–54

| Example | paste no. | Test A (weight loss in miligrams in 0.1 N HCl) | | Test B (weight loss in miligrams in 0.1 N NaOH) | |
|---|---|---|---|---|---|
| | | fired glaze weight (g) | weight loss (mg) | fired glaze weight (g) | weight loss (mg) |
| 46 | 37 | 0.0216 | 0.5 | 0.0216 | 0.2 |
| 47 | 38 | 0.0259 | 0.22 | 0.0246 | 0.26 |
| 48 | 39 | 0.0244 | 0.22 | 0.0251 | 0.22 |
| 49 | 40 | 0.0226 | 3.4 | 0.0227 | 0.18 |
| 50 | 41 | 0.0243 | 0.14 | 0.0248 | 0.08 |
| 51 | 42 | 0.0223 | 0.26 | 0.0228 | 0.34 |
| 52 | 43 | 0.0234 | 1.78 | 0.0236 | 0.08 |
| 53 | 44 | 0.0270 | 0.06 | 0.0262 | 0.18 |
| 54 | 45 | 0.0246 | 0.56 | 0.0241 | 0.2 |

TABLE VII

Fired overglazes durability data given in terms of weight loss in weight %

Examples Nos. 46–54

| | | 46 | 47 | 48 | 49 | 50 | 51 | 52 | 53 | 54 |
|---|---|---|---|---|---|---|---|---|---|---|
| paste 37 | A | 2.3 | — | — | — | — | — | — | — | — |
| | B | 0.9 | — | — | — | — | — | — | — | — |
| paste 38 | A | — | 0.84 | — | — | — | — | — | — | — |
| | B | — | 1.0 | — | — | — | — | — | — | — |
| paste 39 | A | — | — | 0.9 | — | — | — | — | — | — |
| | B | — | — | 0.87 | — | — | — | — | — | — |
| paste 40 | A | — | — | — | 15.0 | — | — | — | — | — |
| | B | — | — | — | 0.8 | — | — | — | — | — |
| paste 41 | A | — | — | — | — | 0.57 | — | — | — | — |
| | B | — | — | — | — | 0.3 | — | — | — | — |
| paste 42 | A | — | — | — | — | — | 1.1 | — | — | — |
| | B | — | — | — | — | — | 1.5 | — | — | — |
| paste 43 | A | — | — | — | — | — | — | 7.6 | — | — |
| | B | — | — | — | — | — | — | 0.3 | — | — |
| paste 44 | A | — | — | — | — | — | — | — | 0.2 | — |
| | B | — | — | — | — | — | — | — | 0.7 | — |
| paste 45 | A | — | — | — | — | — | — | — | — | 2.2 |
| | B | — | — | — | — | — | — | — | — | 0.83 |

It is evident that the compositions according to the present invention exhibit very good durability in acidic and/or basic conditions.

All the above description and examples have been provided for the purpose of illustration, and are not intended to limit the invention in any way.

What is claimed is:

1. A glass composition comprising, in mole percent of the total composition:
   glass forming compounds in a total amount of 75 to 85%, wherein said glass forming compounds comprise 40 to 65% $SiO_2$, 10 to 20% $Bi_2O_3$, 0.1 to 3% $Al_2O_3$, $B_2O_3$ in an amount not higher than 15 mole % of the total composition, and at least one glass forming compound selected from the group consisting of $GeO_2$, $P_2O_5$, $Sb_2O_3$, $TeO_2$, $TiO_2$, $ZrO_2$ and mixtures thereof, and glass modifiers in a total amount of 15 to 25%, wherein said glass modifiers comprise 1 to 23% ZnO, 0.1 to 5% CuO, 0.1 to 5% CaO and 0.1 to 2% MgO.

2. A glass composition according to claim 1, comprising $TiO_2$ and/or $ZrO_2$, the total amount of said $TiO_2$ and/or $ZrO_2$ being at most 5 mole % of the total composition.

3. A glass composition according to claim 1, comprising in addition to ZnO, CuO, CaO and MgO, glass modifiers selected from the group consisting of BaO, SrO, oxides and/or fluorides of alkali metals, oxides of transition metals, said transition metals having an atomic number between 24 to 28, inclusive, and mixtures thereof.

4. A glass composition according to claim 3, it comprising BaO or SrO, the amount of said BaO or SrO being at most 5 mole % of the total composition.

5. A glass composition according to claim 3, comprising alkali oxides and/or fluorides selected from the group consisting of $Li_2O$, $Na_2O$, LiF and NaF, the total amount of said alkali oxides and/or fluorides being at most 6 mole % of the total composition.

6. A glass composition according to claim 3, comprising oxides of transition metals, the total amount of said oxides being at most 8 mole % of the total composition.

7. A glass composition according to claim 5 comprising, in mole % of total composition: 45 to 63% $SiO_2$, 12 to 18% $Bi_2O_3$, 0.5 to 2.5% $Al_2O_3$, 5 to 13% $B_2O_3$ 6 to 18% ZnO, 0.5 to 5% CuO, 2 to 4 mole % CaO, 0.5 to 2% MgO, $TiO_2$ and/or $ZrO_2$ in the total amount of 1 to 5 mole %, and at least one compound selected from the group consisting of $Li_2O$, $Na_2O$, LiF and NaF, in a total amount of at most 6%.

8. A glass composition according to claim 7, comprising, in mole % of the total composition:
   49% $SiO_2$, 15% $Bi_2O_3$, 2.0% $Al_2O_3$, 10% $B_2O_3$, 10% ZnO, 1% CuO, 4 CaO %, 1% MgO, 2% $TiO_2$, 1% $ZrO_2$, 3% LiF and 2% NaF.

9. A glass composition according to claim 3, comprising, in mole percent of the total composition:
   45 to 63% $SiO_2$, 12 to 18% $Bi_2O_3$, 0.5 to 2.5% $Al_2O_3$, 5 to 12 % $B_2O_3$, 6 to 18% ZnO, 0.5 to 5% CuO, 2 to 4 mole % CaO, 0.5 to 2% MgO, $TiO_2$ and/or $ZrO_2$ in a total amount of 1 to 5 mole %, and BaO in a concentration of at most 5 mole %.

10. A thick film formulation comprising solids which are finely divided particles of the glass according to claim 1, dispersed in an organic medium.

11. A thick film formulation according to claim 10, further comprising additional solids which are conductive metal particles, wherein 0.5 to 80 weight % glass particles and 20 to 99.5 weight % conductive particles are dispersed in the organic medium.

12. A thick film formulation according to claim 10, further comprising additional solids which are ceramic fillers, the weight of said ceramic fillers being at most 20% of the total weight of solids dispersed in the organic medium.

13. A thick film formulation according to claim 12, wherein the ceramic fillers comprise vitreous silica, zircon or mixtures thereof.

14. An article comprising a formulation according to claims 10, 11, 12 or 13, fired on a ceramic substrate.

15. A glass composition comprising, in mole % of the total composition:
   glass forming compounds in a total amount of 75–85%, wherein said glass forming compounds comprise 40–65% $SiO_2$, 10–20% $Bi_2O_3$, 0.1 to 3% $Al_2O_3$, and $B_2O_3$ in an amount not higher than 15 mole % of the total composition, and
   glass modifiers in the total amount of 15–25%, wherein said glass modifiers comprise 1–23% ZnO, 0.1 to 5% CuO, 0.1 to 5 CaO and 0.1 to 2% MgO.

16. A glass composition comprising, in mole % of the total composition:
   glass forming compounds in a total amount of 75–85%, wherein said glass forming compounds comprise 45–63% $SiO_2$, 12–18% $Bi_2O_3$, 0.5 to 2.5% $Al_2O_3$, 5–13% $B_2O_3$, and $TiO_2$ and/or $ZrO_2$ in a total amount of 1–5 mole % and glass modifiers in the total amount of 15–25%, wherein said glass modifiers comprise 6–18% ZnO, 0.5 to 5% CuO, 2 to 4% CaO and 0.5 to 2% MgO, at least one compound selected from the group consisting of $LiO_2$, $Na_2O$, LiF, and NaF, said at least one compound in a total amount of at most 6 mole %, and other glass modifiers selected from the group consisting of BaO, SrO, oxides of transition metals, said transition metals having an atomic number between 24 to 28, inclusive, and mixtures thereof.

17. A glass composition comprising, in mole % of the total composition:

glass forming compounds in a total amount of 75–85%, wherein said glass forming compounds comprise 45–63% $SiO_2$, 12–18% $Bi_2O_3$, 0.5 to 2.5% $Al_2O_3$, 5–12% $B_2O_3$, and $TiO_2$ and/or $ZrO_2$ in a total amount of 1–5 mole % and, glass modifiers in a total amount of 15–25%, wherein said glass modifiers comprise 6–18% ZnO, 0.5 to 5% CuO, 2 to 4 mole % CaO, and 0.5 to 2% MgO, BaO in a concentration of at most 5 mole %, and other glass modifiers selected from the group consisting of SrO, oxides and/or fluorides of alkali metals, oxides of transition metals, said transition metals having an atomic number between 24 to 28, inclusive, and mixtures thereof.

* * * * *

UNITED STATES PATENT AND TRADEMARK OFFICE
CERTIFICATE OF CORRECTION

PATENT NO. : 6,171,987 B1
DATED : January 9, 2001
INVENTOR(S) : Hormadaly

Page 1 of 1

It is certified that error appears in the above-identified patent and that said Letters Patent is hereby corrected as shown below:

Column 1,
Line 53, "a" should read -- α --.

Column 2,
Line 32, begin a new paragraph with "U.S.".

Column 4,
Line 29, "Of" should read -- of --.

Column 7,
Line 13, after "medium.", insert -- In one preferred embodiment of the present invention, the thick film formulation comprises --.

Column 10,
Line 8, "sample" should read -- samples --.

Column 14,
Line 7, delete "it".
Line 28, "4 CaO %" should read -- 4% CaO --.
Line 63, "5 CaO" should read -- 5% CaO --.

Signed and Sealed this

Twenty-fifth Day of December, 2001

*Attest:*

*Attesting Officer*

JAMES E. ROGAN
*Director of the United States Patent and Trademark Office*